(12) United States Patent
Liu et al.

(10) Patent No.: US 12,610,473 B2
(45) Date of Patent: Apr. 21, 2026

(54) CIRCUIT BOARD AND METHOD OF FABRICATING THE SAME

(71) Applicants: HongQiSheng Precision Electronics (QinHuangdao) Co., Ltd., Hebei Province (CN); Avary Holding (Shenzhen) Co., Ltd., Shenzhen (CN); Garuda Technology Co., Ltd., New Taipei City (TW)

(72) Inventors: Li-Kun Liu, Hebei Province (CN); Yang Li, Hebei Province (CN); Chao Wang, Hebei Province (CN)

(73) Assignees: HONGQISHENG PRECISION ELECTRONICS (QINHUANGDAO) CO., LTD.; CHINA AVARY HOLDING (SHENZHEN) CO., LTD., Shenzhen (CN); GARUDA TECHNOLOGY CO., LTD., New Taipei City (CN)

( * ) Notice: Subject to any disclaimer, the term of this patent is extended or adjusted under 35 U.S.C. 154(b) by 219 days.

(21) Appl. No.: 18/642,180

(22) Filed: Apr. 22, 2024

(65) Prior Publication Data

US 2025/0331106 A1     Oct. 23, 2025

(51) Int. Cl.
| | |
|---|---|
| *H05K 3/36* | (2006.01) |
| *H05K 1/02* | (2006.01) |
| *H05K 1/03* | (2006.01) |
| *H05K 1/14* | (2006.01) |

(Continued)

(52) U.S. Cl.
CPC ........... *H05K 3/361* (2013.01); *H05K 1/0393* (2013.01); *H05K 3/4038* (2013.01); *H05K*

*3/4691* (2013.01); *H05K 2201/0326* (2013.01); *H05K 2201/042* (2013.01); *H05K 2201/058* (2013.01);

(Continued)

(58) Field of Classification Search
CPC .. H05K 3/361; H05K 2201/091; H05K 1/028; H05K 1/0283; H05K 1/147; H05K 1/189
See application file for complete search history.

(56) References Cited

U.S. PATENT DOCUMENTS

| | | | |
|---|---|---|---|
| 12,382,579 B2 * | 8/2025 | Wang | H05K 3/107 |
| 2020/0111978 A1 * | 4/2020 | Kim | H10D 86/443 |
| 2020/0146150 A1 * | 5/2020 | Nagamine | H05K 3/22 |

FOREIGN PATENT DOCUMENTS

| | | |
|---|---|---|
| CN | 100459313 C | 2/2009 |
| CN | 113242643 A | 8/2021 |
| CN | 114286503 A | 4/2022 |

(Continued)

*Primary Examiner* — Sherman Ng
(74) *Attorney, Agent, or Firm* — Muncy, Geissler, Olds & Lowe, P.C.

(57) ABSTRACT

A circuit board and a method of fabricating the same are provided. The circuit board has a connecting part and a bending part, and this circuit board includes a plurality of flexible circuit substrates electrically connected to each other and an elastic material. The flexible circuit substrate with a corrugated region is located on the bending part and is disposed on another flexible circuit substrate. A spacing is formed between those two flexible circuit substrates, while this spacing is located at the bending part. The elastic material is located at one of the flexible circuit substrates and located inside the spacing, and the elastic material is located inside a trough of the corrugated region.

17 Claims, 10 Drawing Sheets

(51) Int. Cl.
      *H05K 3/40*                    (2006.01)
      *H05K 3/46*                    (2006.01)
(52) U.S. Cl.
      CPC ...  *H05K 2201/091* (2013.01); *H05K 2203/06*
                                                    (2013.01)

(56)                    References Cited

FOREIGN PATENT DOCUMENTS

CN          116156770  A      5/2023
CN          116347753  A      6/2023

* cited by examiner

140'

143'
141'

143'
141'

CIRCUIT BOARD AND METHOD OF FABRICATING THE SAME

BACKGROUND

Technical Field

The present disclosure relates to a circuit board and the method for fabrication of the same. More particular, the present disclosure relates to the circuit board including flexible substrates and the method for fabrication of the same.

Description of Related Art

Flexible circuit boards have advantages of their flexibility and light-weighting. Recently, the application of flexible circuit boards in smart phones is increased with the booming of smart phones and the development of foldable smart phones. Since the application field of flexible circuit boards is broadened, the requirements for the quality of flexible circuit boards are increased in order to meet the variety of demands for application. However, the flexural strength of the existing flexible circuit boards is limited, so that the cables of the flexible circuit boards are prone to be damaged when the flexible circuit boards are disposed inside the hinges of the foldable screens.

SUMMARY

Accordingly, the disclosure is to provide a circuit board and the method for fabrication of the same, thereby increasing the flexural strength of the circuit board.

At least one embodiment of the disclosure provides the method for fabrication the aforementioned circuit board.

At least one embodiment of the disclosure provides a circuit board having a bending part and at least one connecting part includes a first flexible circuit substrate including a corrugated region which is located at the bending part of the circuit board. The circuit board includes at least a second flexible circuit substrate which is electrically connected to the first flexible circuit substrate disposed on the second flexible circuit substrate. A spacing is formed between the first flexible circuit substrate and the second flexible circuit substrate, and the spacing is located at the bending part. The circuit board includes an elastic material which are disposed on the second flexible circuit substrate and located inside the spacing. The elastic material is located inside a trough of the corrugated region.

At least in one embodiment of the disclosure, the circuit board further includes two first protective layers which are disposed on the corrugated region of the first flexible circuit substrate and cover two opposite sides of the first flexible circuit substrate separately. The circuit board further includes at least one second protective layer which is disposed on a surface of the second flexible circuit substrate. The second flexible circuit substrate is located between the second protective layer and the first flexible circuit substrate.

At least in one embodiment of the disclosure, when the circuit board is under a flattened state, a thickness of the bending part is larger than a thickness of the connecting part.

At least in one embodiment of the disclosure, the circuit board further includes at least one adhesive layer which is disposed on the connecting part of the circuit board and located between the first flexible circuit substrate and the second flexible circuit substrate. The adhesive layer covers the first flexible circuit substrate.

At least in one embodiment of the disclosure, the circuit board further includes at least one third circuit substrate which is disposed on the connecting part of the circuit board and electrically connected to the first flexible circuit substrate and the second flexible circuit substrate. The third circuit substrate is located between the first flexible circuit substrate and the second flexible circuit substrate.

At least in one embodiment of the disclosure, the third circuit substrate is a flexible board.

At least in one embodiment of the disclosure, the circuit board further includes a plurality of metal components which are disposed on an end section of the third circuit substrate.

At least in one embodiment of the disclosure, the metal components are disposed on an end section of the first flexible circuit substrate.

At least in one embodiment of the disclosure, the circuit board further includes an electronic component which is disposed on the third circuit substrate.

At least one embodiment of the disclosure provides a method for fabricating a circuit board. The method includes providing a first flexible circuit substrate, bending a first region of the first flexible circuit substrate to form a corrugated region, providing two second flexible circuit substrates, disposing a plurality of elastic materials on a second region of each of the second flexible circuit substrates, providing four third circuit substrates, disposing the third circuit substrates on the first flexible circuit substrate, so that one edge of the first flexible circuit substrate is located between two of the third circuit substrates, and the other edge of the first flexible circuit substrate is located between the other two of the third circuit substrates. The third circuit substrates expose the corrugated region of the first flexible circuit substrate. The method includes disposing the second flexible circuit substrates on the third circuit substrates after the elastic materials are disposed on the second region of each of the second flexible circuit substrates, so that the first flexible circuit substrate and the third circuit substrate are located between two second flexible circuit substrates. The corrugated region of the first flexible circuit substrate overlaps the second regions of the second flexible circuit substrates, and the elastic materials are located between the second flexible circuit substrates. The elastic materials are located inside a plurality of troughs of the corrugated region separately.

At least in one embodiment of the disclosure, the method further includes forming a first protective layer on each of two opposite surfaces of the first flexible circuit substrate before the first region of the first flexible circuit substrate is bent. The first protective layers cover the first region of the first flexible circuit substrate. The method further includes forming a part of a second protective layer on one surface of each second flexible circuit substrate before the elastic materials are disposed on the second region of each of the second flexible circuit substrates, and the part of the second protective layer covers the second regions of the second flexible circuit substrates. The elastic materials and the second protective layer are located at two opposite sides of the second flexible circuit substrate separately.

At least in one embodiment of the disclosure, the method further includes disposing a first adhesive material on two opposite sides of the first flexible circuit substrate separately before the third circuit substrates are disposed on the first flexible circuit substrate. The first adhesive materials expose the corrugated region of the first flexible circuit substrate. The method further includes laminating the first flexible circuit substrate, the first adhesive materials and the third circuit substrates after the first adhesive materials are disposed on the first flexible circuit substrate, so that two of the third circuit substrates are disposed on one of the first adhesive materials, and the other two of the third circuit substrates are disposed on the other one of the first adhesive materials. The method further includes disposing a second adhesive material separately on two of each third circuit substrates located on two opposite sides of the first flexible circuit substrate before the second flexible circuit substrates are disposed on the third circuit substrates. The second adhesive materials expose the corrugated region of the first flexible circuit substrate. The second flexible circuit substrates, the third circuit substrates and the second adhesive materials are laminated after the second adhesive materials are disposed on the third circuit substrates, so that the second flexible circuit substrates are disposed on the second adhesive materials separately, and the second adhesive materials are located between the second flexible circuit substrates.

At least in one embodiment of the disclosure, the method further includes forming a plurality of first conductive vias after the third circuit substrates are disposed on the first adhesive materials. The first conductive vias extend from a first circuit layer of the first flexible circuit substrate to a third circuit layer of one of the third circuit substrates. The plurality of second conductive vias are formed after the second flexible circuit substrates are disposed on the second adhesive materials separately. The second conductive vias extend from a second circuit layer of the second flexible circuit substrates to the third circuit layer of one of the third circuit substrates.

At least in one embodiment of the disclosure, the laminating the second flexible circuit substrates, the third circuit substrates and the second adhesive materials includes disposing two supporting plates on the second protective layer of each of the second flexible circuit substrates separately. The supporting plates cover a region of the second flexible circuit substrates, and the corrugated region of the first flexible circuit substrate overlaps the region.

At least in one embodiment of the disclosure, the method further includes disposing an electronic component on the third circuit substrates.

According to the aforementioned embodiments, the elastic materials are disposed on the second flexible circuit substrate in the bending part, and the elastic materials are disposed inside the troughs of the corrugated region of the first flexible circuit substrate in the disclosure. Therefore, when the bending part of the circuit board is bent by the external force, the corrugated region is stretched, and the elastic materials may lead the corrugated region to be restored from the stretched state (i.e. the corrugated region is restored to its original corrugated state from the stretched state) when the bending part is flattened, thereby improving the flexural strength of the circuit board.

BRIEF DESCRIPTION OF THE DRAWINGS

To illustrate more clearly the aforementioned and the other features, merits, and embodiments of the present disclosure, the description of the accompanying figures are as follows.

DETAILED DESCRIPTION

Figure 1:
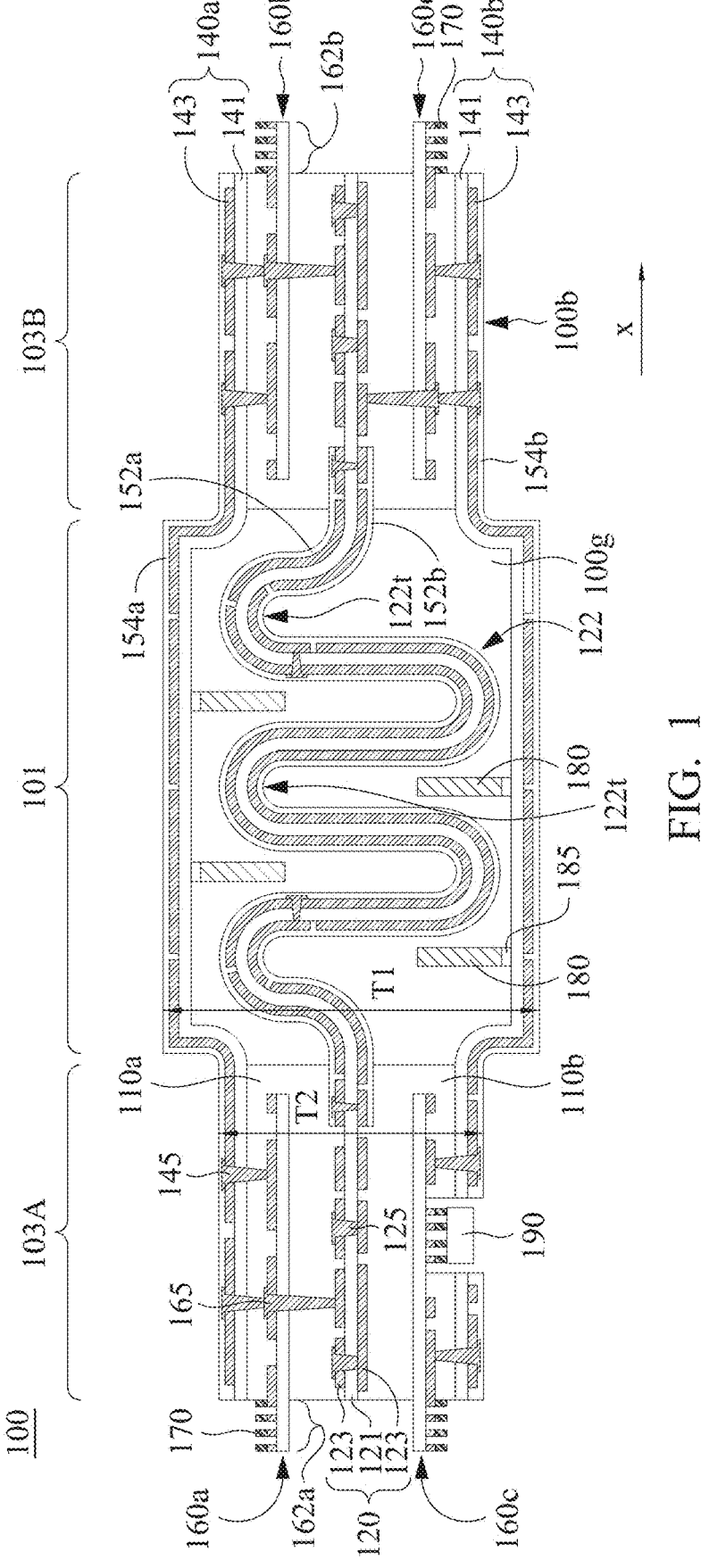
FIG. 1 illustrates a cross-sectional view of a circuit board in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, the dimensions (such as lengths, widths and thicknesses) of components (such as layers, films, substrates and regions) in the drawings are enlarged not-to-scale, and the number of components may be reduced in order to clarify the technical features of the disclosure. Therefore, the following illustrations and explanations are not limited to the number of components, the number of components, the dimensions and the shapes of components, and the deviation of size and shape caused by the practical procedures or tolerances are included. For example, a flat surface shown in drawings may have rough and/or non-linear features, while angles shown in drawings may be circular. As a result, the drawings of components shown in the disclosure are mainly for illustration and not intended to accurately depict the real shapes of the components, nor are intended to limit the scope of the claimed content of the disclosure.

Further, when a number or a range of numbers is described with "about," "approximate," "substantially," and the like, the term is intended to encompass numbers that are within a reasonable range considering variations that inherently arise during manufacturing as understood by one of ordinary skill in the art. In addition, the number or range of numbers encompasses a reasonable range including the number described, such as within +/−30%, +/−20%, +/−10% or +/−5% of the number described, based on known manufacturing tolerances associated with manufacturing a feature having a characteristic associated with the number. The words of deviations such as "about," "approximate," "substantially," and the like are chosen in accordance with the optical properties, etching properties, mechanical properties or other properties. The words of deviations used in the optical properties, etching properties, mechanical properties or other properties are not chosen with a single standard.

The circuit board 100 is disclosed. Referring to FIG. 1, the circuit board 100 has the bending part 101 and the connecting part 103A and the connecting part 103B, and the bending part 101 is located between the connecting part 103A and the connecting part 103B. The circuit board 100 includes the first flexible circuit substrate 120, the second flexible circuit substrate 140a and the second flexible circuit substrate 140b, the third circuit substrate 160a, the third circuit substrate 160b, the third circuit substrate 160c and the third circuit substrate 160d and the plurality of elastic materials 180. The first flexible circuit substrate 120 includes the corrugated region 122 which is located at the bending part 101 of the circuit board 100.

The first flexible circuit substrate 120 includes the insulation layer 121 and two circuit layers 123 disposed on two opposite sides of the insulation layer 121. One of the circuit layers 123 is electrically connected to the other one of the circuit layers 123 through the plurality of conductive vias 125. Although the first flexible circuit substrate 120 includes two circuit layers 123 in the embodiment, the disclosure is not limited to this embodiment. In other embodiments, the first flexible circuit substrate 120 may include one circuit layer 123, while this circuit layer 123 is disposed on one side of the insulation layer 121.

It is worth mentioning, although the corrugated region 122 in FIG. 1 has six corrugated layers (i.e. the corrugated region 122 is fold five times and formed five vertexes), the disclosure is not limited to this embodiment. In other embodiments, the quantity of the corrugated layers depends on the width of the bending part 101 of the circuit board 100 along the x-axis. That is, the quantity of the corrugated layers of the corrugated region 122 may be more than or equal to two, such as three.

The first flexible circuit substrate 120 is disposed on the second flexible circuit substrate 140a and the second flexible circuit substrate 140b and is located between the second flexible circuit substrate 140a and the second flexible circuit substrate 140b. The second flexible circuit substrate 140a and the second flexible circuit substrate 140b are electrically connected to the first flexible circuit substrate 120. In this embodiment, each of the second flexible circuit substrate 140a and the second flexible circuit substrate 140b includes the insulation layer 141 and the circuit layer 143 which is disposed on one side of the insulation layer 141.

In addition, the third circuit substrate 160a, the third circuit substrate 160b, the third circuit substrate 160c and the third circuit substrate 160d are disposed on the connecting part 103A and the connecting part 103B and are electrically connected to the first flexible circuit substrate 120, the second flexible circuit substrate 140a and the second flexible circuit substrate 140b. Specifically, the third circuit substrate 160a, the third circuit substrate 160b, the third circuit substrate 160c and the third circuit substrate 160d are disposed on the connecting part 103A and the connecting part 103B in pairs. Furthermore, in the connecting part 103A (or in the connecting part 103B), one of the two third circuit substrates is located between the first flexible circuit substrate 120 and one of the second flexible circuit substrates, while the other one of the two third circuit substrates is located between the first flexible circuit substrate 120 and the other one of the second flexible circuit substrates.

More specifically, referring to FIG. 1, the third circuit substrate 160a in the connecting part 103A is located between the first flexible circuit substrate 120 and the second flexible circuit substrate 140a, while the third circuit substrate 160c is located between the first flexible circuit substrate 120 and the second flexible circuit substrate 140b. The third circuit substrate 160b in the connecting part 103B is located between the first flexible circuit substrate 120 and the second flexible circuit substrate 140a, while the third circuit substrate 160d is located between the first flexible circuit substrate 120 and the second flexible circuit substrate 140b.

It is worth mentioning, the spacing (not denoted) which is located at the bending part 101 is formed between the first flexible circuit substrate 120 and the second flexible circuit substrate 140a and located between the first flexible circuit substrate 120 and the second flexible circuit substrate 140b. Thus, the corrugated region 122 of the first flexible circuit substrate 120 may be placed within this spacing. In addition, the third circuit substrate 160a, the third circuit substrate 160b, the third circuit substrate 160c and the third circuit substrate 160d may be flexible boards or rigid boards.

The disclosure is not limited to the aforementioned embodiments. In another embodiment, the circuit board 100 may have only one second flexible circuit substrate (e.g. the second flexible circuit substrate 140a) and the third circuit substrates on its one side (e.g. the third circuit substrate 160a and the third circuit substrate 160b). Further, in the other embodiments, the circuit board 100 may be without any of the third circuit substrates. In addition, the second flexible circuit substrate 140a and the second flexible circuit substrate 140b are electrically connected to the third circuit substrate 160a, the third circuit substrate 160b, the third circuit substrate 160c and the third circuit substrate 160d through the plurality of conductive vias 145 and is electrically connected to the first flexible circuit substrate 120 through the plurality of conductive vias 165. In other words, the third circuit substrate 160a, the third circuit substrate 160b, the third circuit substrate 160c and the third circuit substrate 160d are electrically connected to the first flexible circuit substrate 120, the second flexible circuit substrate 140a and the second flexible circuit substrate 140b through the conductive vias 145 and through the conductive vias 165.

The elastic materials 180 are disposed on the second flexible circuit substrate 140a and the second flexible circuit substrate 140b and are located inside the aforementioned spacing. Specifically, the elastic materials 180 located on the second flexible circuit substrate 140a are opposite to the elastic materials 180 located on the second flexible circuit substrate 140b. It is worth mentioning, each vertex of the corrugated region 122 includes the trough 122t, and the elastic materials 180 are located inside those troughs 122t of the corrugated region 122. The elastic materials 180 may be springs, spring clips or similarity thereof, but the elastic materials 180 of the disclosure are not limited to those aforementioned components. In some embodiments, the elastic materials 180 may be connected to the second flexible circuit substrate 140a and the second flexible circuit substrate 140b through the fixture materials 185 such as soldering materials, adhesive layers or similarity thereof.

Figure 2:
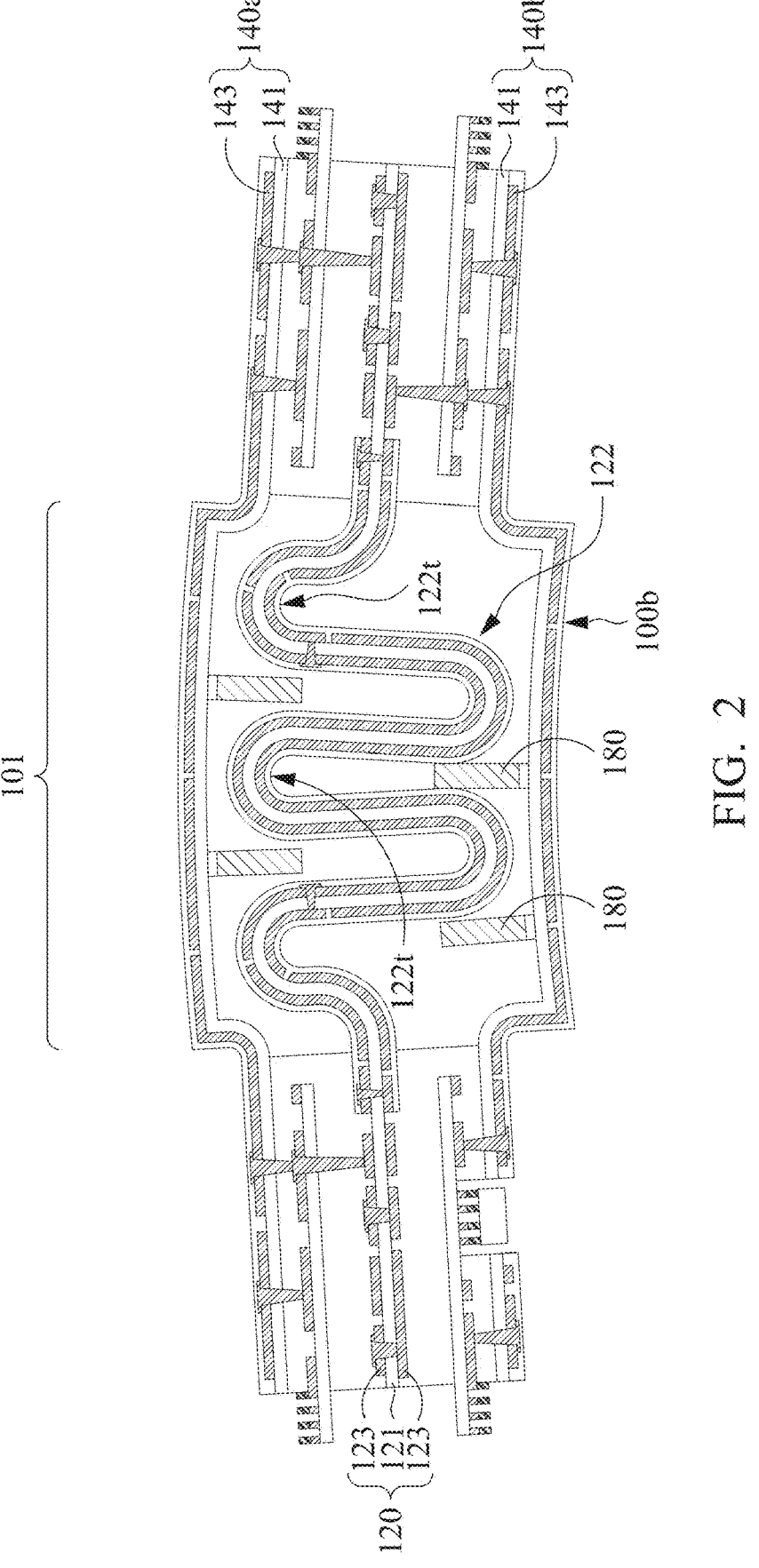
FIG. 2 illustrates a cross-sectional view of a circuit board under the bending stated in accordance with one embodiment of the present disclosure.

When the circuit board 100 is under the bending state, the bending part 101 is bent toward one side of the 100. Referring to FIG. 2, the bending part 101 is bent toward the bottom side 100b of the circuit board 100 in this embodiment. As a result, the corrugated region 122 is bent toward the bottom side 100*b* of the circuit board 100, so that the troughs 122*t* of the corrugated region 122 are deformed (e.g. the corrugated region 122 is bent to be stretched). When the deformation of the troughs 122*t* increase to a certain degree, the elastic materials 180 are pressed by the inner sides of the troughs 122*t*, and the restoring forces of the elastic materials 180 are generated. The restoring forces may drive the deformation of the troughs 122*t* to be restored and then lead the corrugated region 122 to its original corrugated state from the stretched state when the circuit board 100 is flattened.

In the embodiment, the circuit board 100 further includes the adhesive layer 110*a* and the adhesive layer 110*b*. The adhesive layer 110*a* and the adhesive layer 110*b* are disposed on the connecting part 103A and the connecting part 103B of the circuit board 100 and are located between the second flexible circuit substrate 140*a* and the first flexible circuit substrate 120 and located between the second flexible circuit substrate 140*b* and the first flexible circuit substrate 120 separately. The adhesive layer 110*a* and the adhesive layer 110*b* cover the first flexible circuit substrate 120, the third circuit substrate 160*a*, the third circuit substrate 160*b*, the third circuit substrate 160*c* and the third circuit substrate 160*d*. Specifically, the adhesive layer 110*a* is located between the first flexible circuit substrate 120 and the second flexible circuit substrate 140*a* and covers the third circuit substrate 160*a* and the third circuit substrate 160*b*. The adhesive layer 110*b* is located between the first flexible circuit substrate 120 and the second flexible circuit substrate 140*b* and covers the third circuit substrate 160*c* and the third circuit substrate 160*d*.

It is worth mentioning, the adhesive layer 110*a* and the adhesive layer 110*b* only distributed in the connecting part 103A and the connecting part 103B of the circuit board 100 rather than the bending part 101 of the circuit board 100. That is, the gaps 100*g* are located between the first flexible circuit substrate 120 and the second flexible circuit substrate 140*a* and located between the first flexible circuit substrate 120 and the second flexible circuit substrate 140*b* separately. As a result, the bending of the corrugated region 122 of the first flexible circuit substrate 120 is not restricted by the covering of those adhesive layers when the circuit board 100 is under the bending state. Thus, the flexibility of the bending part 101 of the circuit board 100 is increased.

Furthermore, the adhesive layer 110*a* and the adhesive layer 110*b* may expose the end section of each third circuit substrate. For instance, the adhesive layer 110*a* exposes the end section 162*a* of the third circuit substrate 160*a* and also exposes the end section 162*b* of the third circuit substrate 160*b*.

In some embodiments, the circuit board 100 further includes the plurality of metal components 170 which are separately disposed on the end sections of the third circuit substrates. For instance, the metal components 170 may be disposed on the end section 162*a* of the third circuit substrate 160*a*, while the other metal components 170 may be disposed on the end section 162*b* of the third circuit substrate 160*b*. The materials of the metal components 170 may include gold. Specifically, the metal components 170 may be electrically connective components such as gold fingers or similarity thereof.

Referring to FIG. 1, although the metal components 170 are disposed on the third circuit substrates (i.e. the third circuit substrate 160*a*, the third circuit substrate 160*b*, the third circuit substrate 160*c* and the third circuit substrate 160*d*), the disclosure is not limited to this embodiment. In other embodiments, the metal components 170 may be disposed on the end sections (not denoted) of the circuit layers 123 of the first flexible circuit substrate 120 and be electrically connected to the first flexible circuit substrate 120.

Referring to FIG. 1, the circuit board 100 further includes the first protective layer 152*a* and the first protective layer 152*b*. The first protective layer 152*a* and the first protective layer 152*b* are disposed on the corrugated region 122 of the first flexible circuit substrate 120 and cover two opposite surfaces of the first flexible circuit substrate 120 separately. That is, the circuit layers 123 of the first flexible circuit substrate 120 are covered. In addition, the circuit board 100 further includes the second protective layer 154*a* and the second protective layer 154*b*. The second protective layer 154*a* and the second protective layer 154*b* are disposed on the surface of the second flexible circuit substrate 140*a* and the surface of the second flexible circuit substrate 140*b* separately, and the second flexible circuit substrate 140*a* and the second flexible circuit substrate 140*b* are located between the second protective layer 154*a* and the first flexible circuit substrate 120 and located between the second protective layer 154*b* and the first flexible circuit substrate 120 separately.

Specifically, the second protective layer 154*a* is disposed on the second flexible circuit substrate 140*a* and covers the circuit layer 143 of the second flexible circuit substrate 140*a*, while the second protective layer 154*b* is disposed on the second flexible circuit substrate 140*b* and covers the circuit layer 143 of the second flexible circuit substrate 140*b*.

In the embodiment, a part of the surface 140*s* (denoted in FIG. 4C) of the second flexible circuit substrate 140*a* located at the bending part 101 protrudes from a part of the surface 140*s* of the second flexible circuit substrate 140*a* located at the connecting part 103A and connecting part 103B. On the other hand, a part of the surface (not denoted) of the second flexible circuit substrate 140*b* located at the bending part 101 protrudes from a part of the surface (not denoted) of the second flexible circuit substrate 140*b* located at the connecting part 103A and connecting part 103B. Thus, when the circuit board 100 is under the flattened state, the thickness T1 of the bending part 101 is larger than the thickness T2 of the connecting part 103A (or the connecting part 103B), so that the enough space for bending is provided to the corrugated region 122 of the first flexible circuit substrate 120. However, the disclosure is not limited to the embodiment, the thickness T1 of the bending part 101 may be equal to the thickness T2 of the connecting part 103A (or the connecting part 103B) in other embodiments.

It is worth mentioning, although the circuit board 100 in this embodiment is a six-layer circuit board (i.e. the quantity of circuit layers is six), the disclosure is not limited to the embodiment. In other embodiments, the quantity of circuit layers of the circuit board 100 may be more than six, such as eight.

Figure 3A:
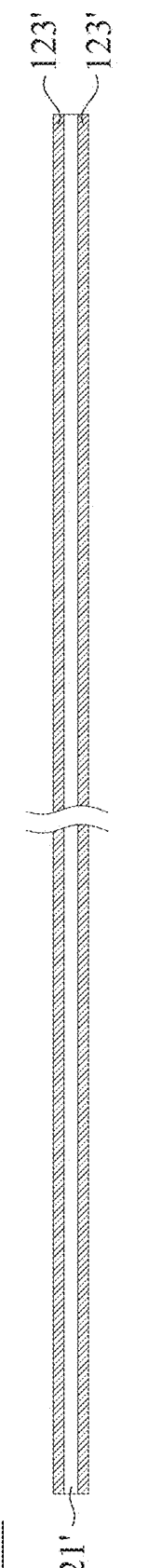
FIG. 3A to FIG. 3E illustrate cross-sectional views of intermediate processes for fabricating a circuit board in accordance with one embodiment of the present disclosure.

The method for fabrication of a circuit board is provided, and the aforementioned circuit board 100 is taken as an example. The fabrication includes sequent steps illustrated in FIG. 3A to FIG. 3E, FIG. 4A to FIG. 4D and FIG. 5A to FIG. 5C. Firstly, the first flexible circuit substrate 120 illustrated in FIG. 1 is provided, and the detailed steps of providing the first flexible circuit substrate 120 are described as follows. Referring to FIG. 3A, the initial flexible circuit substrate 120' is provided, and the initial flexible circuit substrate 120' may be a flexible copper clad laminate (FCCL). The initial flexible circuit substrate 120' includes the initial insulation layer 121' and the metal layers 123' which are located on two opposite sides of the initial insulation layer 121'. The initial insulation layer 121' may be produced from resin, and the metal layers 123' may be deposited on the initial insulation layer 121'. In addition, the materials of the metal layers 123' may include copper.

Figure 3B:
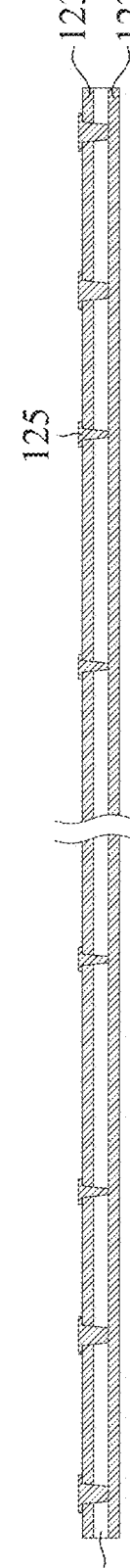

Afterward, referring to FIG. 3B, the initial flexible circuit substrate 120' is drilled or routed to form the insulation layer 121 and to form the plurality of vias (not shown) which connecting two sides of the insulation layer 121. After the vias are formed, the plurality of conductive materials are deposited on the inner walls of the vias separately, and then the plurality of conductive vias 125 are formed. These conductive vias 125 are electrically connected to the metal layers 123' which are located at two sides of the insulation layer 121. In the embodiment, the conductive vias 125 are formed by electroplating, and the materials of the conductive vias 125 include conductive materials such as copper. After the conductive vias 125 are formed, referring to FIG. 3C, the metal layers 123' which are located at two sides of the insulation layer 121 are patterned by the methods of lithography and etching, so that the circuit layers 123 are formed separately. Thus, the first flexible circuit substrate 120 of the circuit board 100 is completed approximately.

Figures 3C, 3D:
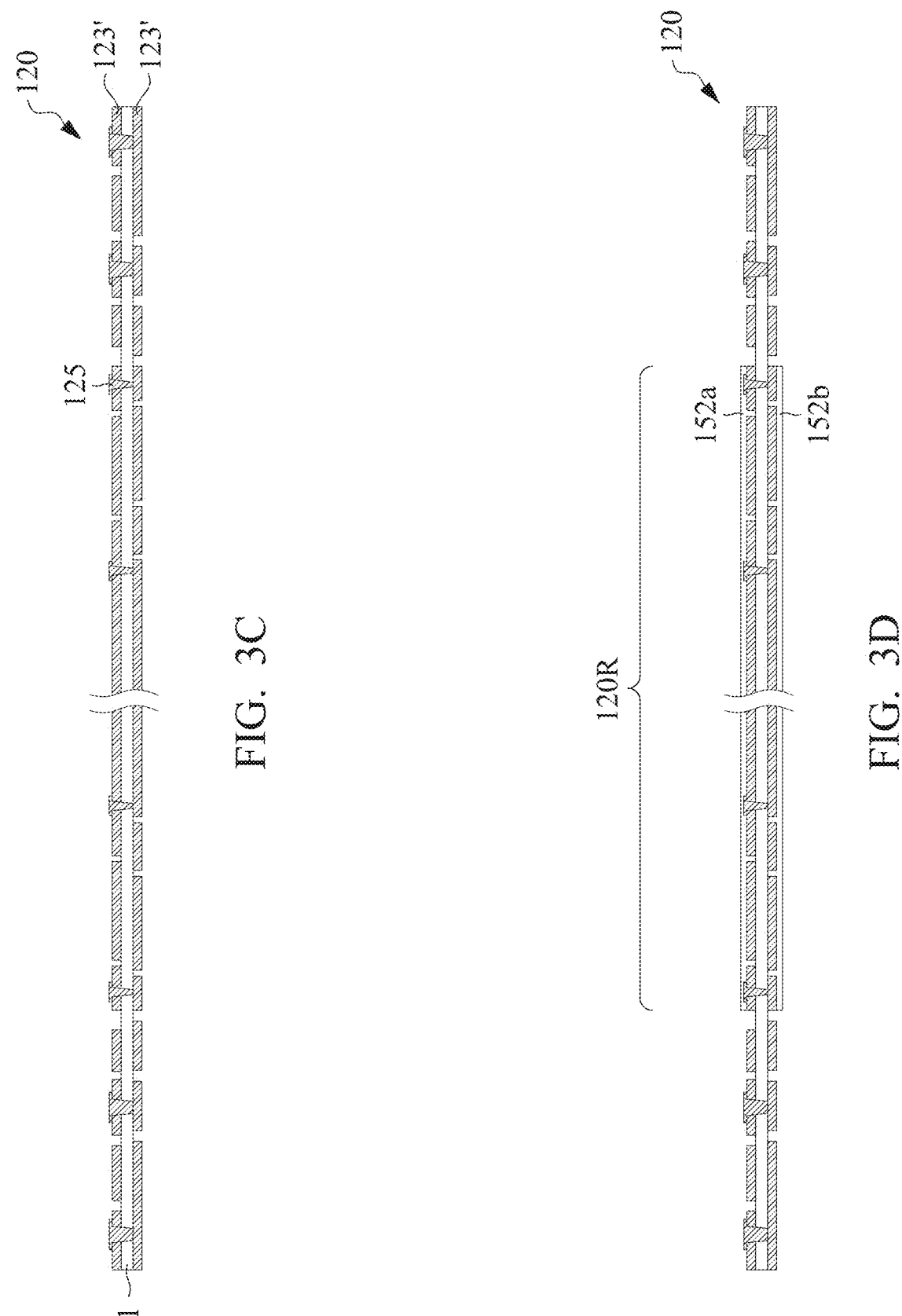
Figure 3E:
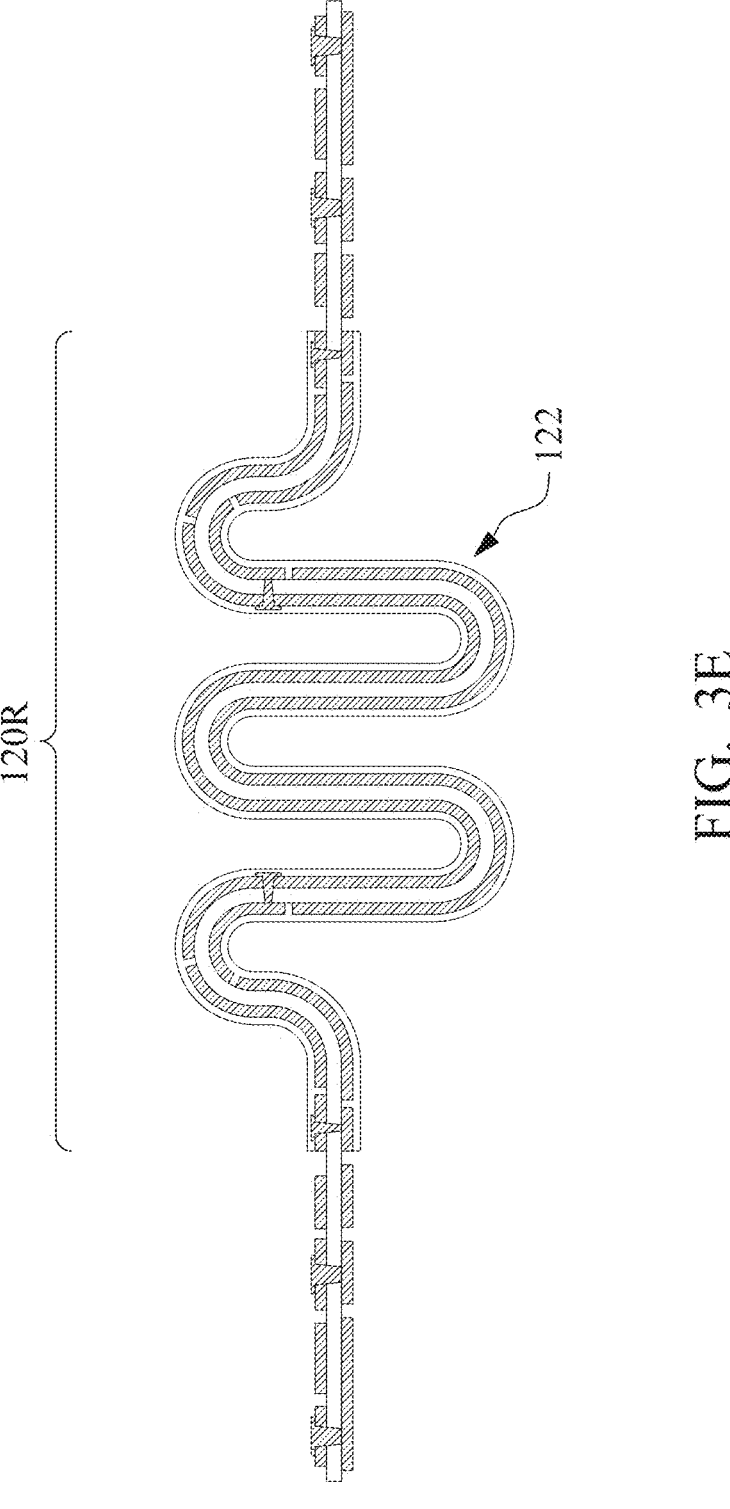

Afterward, referring to FIG. 3D, the first protective layer 152a and the first protective layer 152b are separately formed on two opposite surfaces (not denoted) of the first flexible circuit substrate 120. The first protective layer 152a and the first protective layer 152b cover the region 120R of the first flexible circuit substrate 120. After the first protective layer 152a and the first protective layer 152b are formed, please referring to FIG. 3E, the region 120R of the first flexible circuit substrate 120 is bent, so that the corrugated region 122 is formed from the region 120R.

The method for fabrication of the circuit board 100 further includes providing two second flexible circuit substrates (i.e. the second flexible circuit substrate 140a and the second flexible circuit substrate 140b) illustrated in FIG. 1. Take the second flexible circuit substrate 140a in FIG. 1 as an example, referring to FIG. 4A, the initial flexible circuit substrate 140' is provided firstly, and the initial flexible circuit substrate 140' may be a flexible copper clad laminate. Specifically, the initial flexible circuit substrate 140' in this embodiment includes the initial insulation layer 141' and the metal layer 143' which is located at one side of the initial insulation layer 141'.

Figure 4A:
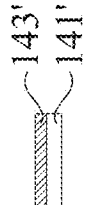
FIG. 4A to FIG. 4D illustrate cross-sectional views of intermediate processes for fabricating a circuit board in accordance with one embodiment of the present disclosure.
Figure 4B:
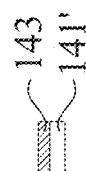

Afterward, referring to FIG. 4B, the metal layer 143' on the initial insulation layer 141' is patterned by the methods of lithography and etching, so that the circuit layer 143 is formed. It is worth mentioning, even though the metal layer 143' is patterned to form the circuit layer 143 in this step of this embodiment, the sequence of the step is not limited to this embodiment. In other embodiments, the circuit layer 143 may be formed in the following steps. Thus, the second flexible circuit substrate 140a of the circuit board 100 is completed approximately.

Figures 4C, 4D:
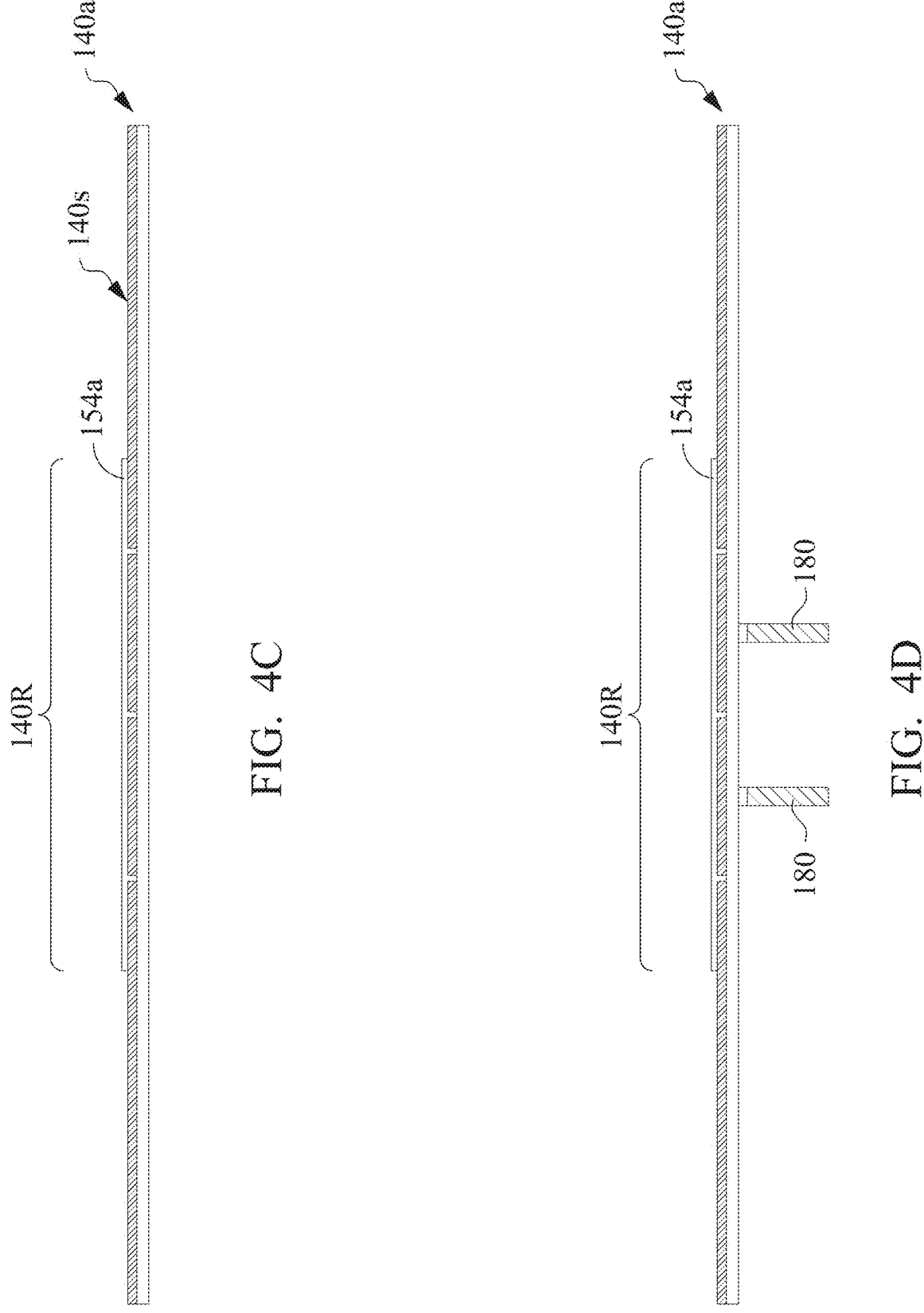

Afterward, referring to FIG. 4C, a part of the second protective layer 154a is formed on the surface 140s of the second flexible circuit substrate 140a, and a part of the second protective layer 154b (not shown in FIG. 4C) is formed on the surface of the second flexible circuit substrate 140b. The part of the second protective layer 154a and the part of the second protective layer 154b cover the region 140R of the second flexible circuit substrate 140a (and cover the region of the second flexible circuit substrate 140b). After the second protective layer 154a is formed, referring to FIG. 4D, the plurality of elastic materials 180 are disposed on the region 140R of the second flexible circuit substrate 140a (and the region of the second flexible circuit substrate 140b) by soldering. It is worth mentioning, the elastic materials 180 and the second protective layer 154a are located at two opposite sides of the second flexible circuit substrate 140a separately, and the elastic materials 180 and the second protective layer 154b are located at two opposite sides of the second flexible circuit substrate 140b separately.

The method for fabrication of the circuit board 100 further includes providing four third circuit substrates (i.e. the third circuit substrate 160a, the third circuit substrate 160b, the third circuit substrate 160c and the third circuit substrate 160d) illustrated in FIG. 1. The process for fabrication of the third circuit substrates is similar to the process for fabrication of the second flexible circuit substrates, and the similarity of these two processes are not repeated herein. However, the differences between the processes for fabrication of the third circuit substrates and the second flexible circuit substrates are as follows. Take the third circuit substrate 160a as an example, after the circuit layer (not denoted) of the third circuit substrate 160a is formed by the method of lithography and etching, the third circuit substrate 160a under penalization may be cut by mechanical cutting or laser cutting, so that the plurality of single panels of the third circuit substrate 160a are formed. The dimensions of these single panels are smaller than the first flexible circuit substrate 120, the second flexible circuit substrate 140a and the second flexible circuit substrate 140b.

Figure 5A:
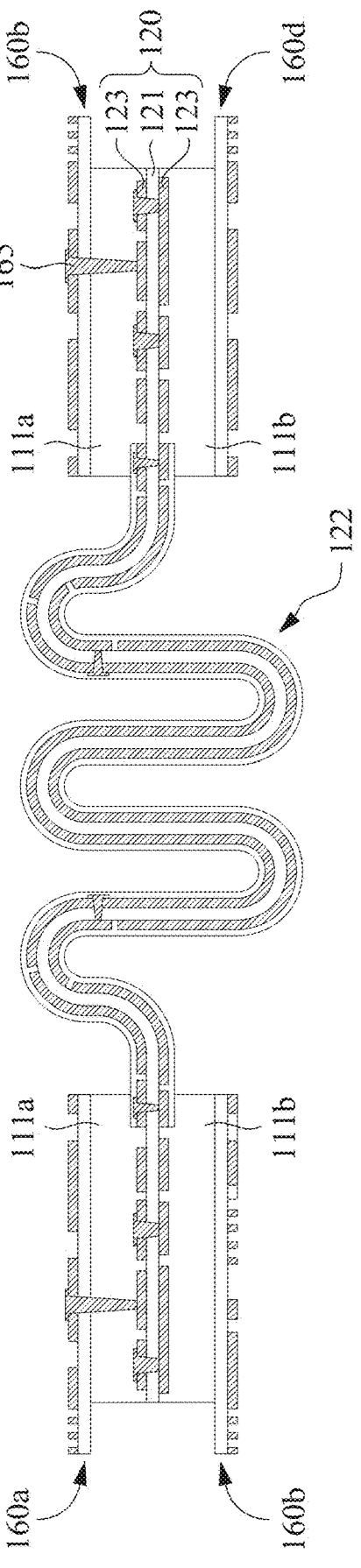
FIG. 5A to FIG. 5C illustrate cross-sectional views of intermediate processes for fabricating a circuit board in accordance with one embodiment of the present disclosure.

After the first flexible circuit substrate 120, the second flexible circuit substrate 140a and the second flexible circuit substrate 140b, the third circuit substrate 160a, the third circuit substrate 160b, the third circuit substrate 160c and the third circuit substrate 160d are formed by the aforementioned processes, referring to FIG. 5A, the third circuit substrate 160a, the third circuit substrate 160b, the third circuit substrate 160c and the third circuit substrate 160d are disposed on the first flexible circuit substrate 120. Thus, one edge (e.g. the left edge) of the first flexible circuit substrate 120 is located between the third circuit substrate 160a and the third circuit substrate 160c, while the other edge (e.g. the right edge) of the first flexible circuit substrate 120 is located between the third circuit substrate 160b and the third circuit substrate 160d. It is worth mentioning, the third circuit substrate 160a, the third circuit substrate 160b, the third circuit substrate 160c and the third circuit substrate 160d expose the corrugated region 122 of the first flexible circuit substrate 120.

In some embodiments, the step illustrated in FIG. 5A further includes disposing the first adhesive material 111a and the first adhesive material 111b separately on two opposite sides of the first flexible circuit substrate 120 before the third circuit substrate 160a, the third circuit substrate 160b, the third circuit substrate 160c and the third circuit substrate 160d are disposed on the first flexible circuit substrate 120. The first adhesive material 111a and the first adhesive material 111b expose the corrugated region 122 of the first flexible circuit substrate 120. The first flexible circuit substrate 120, the first adhesive material 111a, the first adhesive material 111b, the third circuit substrate 160a, the third circuit substrate 160b, the third circuit substrate 160c and the third circuit substrate 160d may be laminated by heat lamination after the first adhesive material 111a and the first adhesive material 111b are disposed on the first flexible circuit substrate 120. Thus, the third circuit substrate 160a and the third circuit substrate 160b are disposed on the first adhesive material 111a, while the third circuit substrate 160c and the third circuit substrate 160d are disposed on the first adhesive material 111b.

In this embodiment, the method for fabrication of the circuit board 100 further includes forming the plurality of conductive vias 165 after the third circuit substrates are disposed on the first adhesive material 111a and the first adhesive material 111b. The conductive vias 165 extend from the circuit layers 123 of the first flexible circuit substrate 120 to the circuit layers of the third circuit substrates (e.g. the third circuit substrate 160a and the third circuit substrate 160b).

Figure 5B:
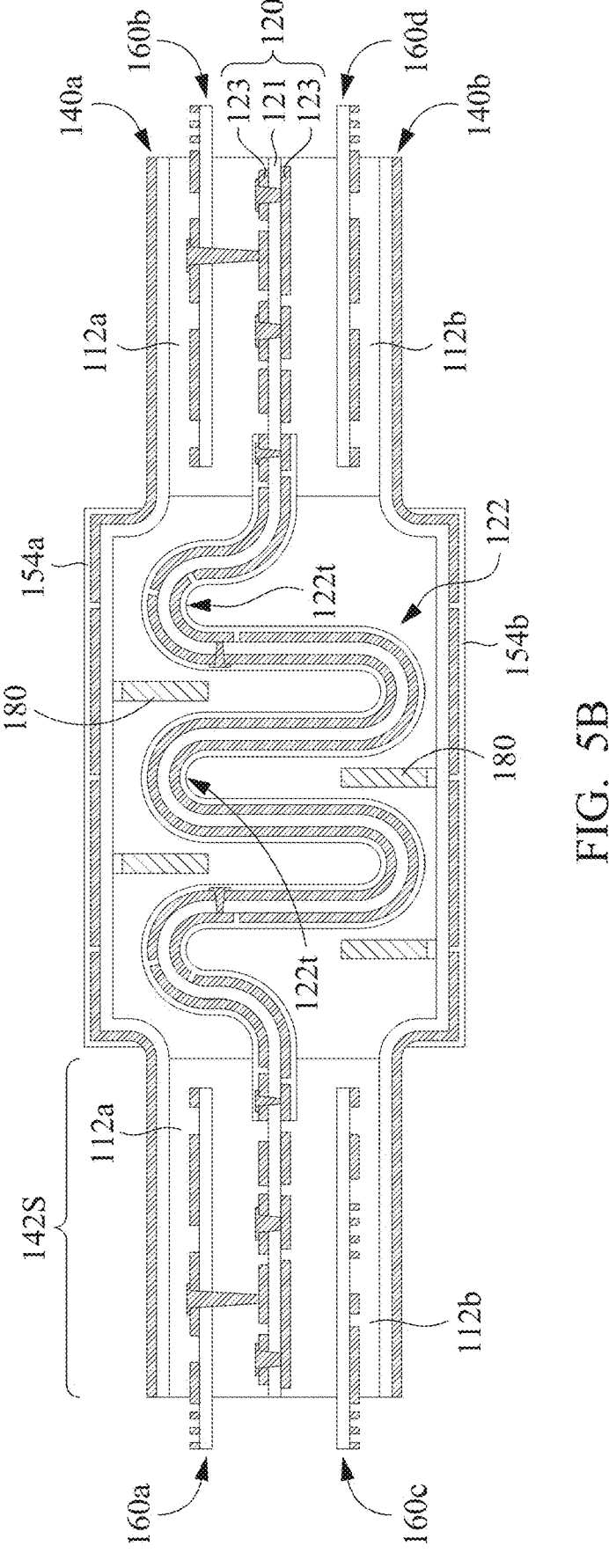

Afterward, referring to FIG. 5B, the second flexible circuit substrate 140a and the second flexible circuit substrate 140b are disposed on the third circuit substrate 160a, the third circuit substrate 160b, the third circuit substrate 160c and the third circuit substrate 160d after the elastic materials 180 are disposed on the region 140R of the second flexible circuit substrates. Thus, the first flexible circuit substrate 120 and the third circuit substrate 160a, the third circuit substrate 160b, the third circuit substrate 160c and the third circuit substrate 160d are located between the second flexible circuit substrate 140a and the second flexible circuit substrate 140b. The corrugated region 122 of the first flexible circuit substrate 120 overlaps the region 140R (denoted in FIG. 4D) of the second flexible circuit substrate 140a and the second flexible circuit substrate 140b, while the elastic materials 180 are located between the second flexible circuit substrate 140a and the second flexible circuit substrate 140b. The elastic materials 180 are separately located inside the plurality of troughs 122t of the corrugated region 122.

It is worth mentioning, the method further includes disposing the second adhesive material 112a and the second adhesive material 112b separately on the third circuit substrate 160a and the third circuit substrate 160b and on the third circuit substrate 160c and the third circuit substrate 160d, which are located on two sides of the first flexible circuit substrate 120, before the second flexible circuit substrate 140a and the second flexible circuit substrate 140b are disposed on the third circuit substrate 160a, the third circuit substrate 160b, the third circuit substrate 160c and the third circuit substrate 160d. Specifically, the second adhesive material 112a is disposed on the third circuit substrate 160a and the third circuit substrate 160b, while the second adhesive material 112b is disposed on the third circuit substrate 160c and the third circuit substrate 160d. Furthermore, the second adhesive material 112a and the second adhesive material 112b expose the corrugated region 122 of the first flexible circuit substrate 120.

The second flexible circuit substrate 140a, the second flexible circuit substrate 140b, the third circuit substrate 160a, the third circuit substrate 160b, the third circuit substrate 160c, the third circuit substrate 160d, the second adhesive material 112a and the second adhesive material 112b are laminated by heat lamination after the second adhesive material 112a and the second adhesive material 112b are disposed on the third circuit substrate 160a, the third circuit substrate 160b, the third circuit substrate 160c and the third circuit substrate 160d. Thus, the second flexible circuit substrate 140a and the second flexible circuit substrate 140b are disposed on the second adhesive material 112a and the second adhesive material 112b separately, while the second adhesive material 112a and the second adhesive material 112b are located between the second flexible circuit substrate 140a and the second flexible circuit substrate 140b.

It is worth mentioning, the aforementioned steps of lamination in some embodiments includes disposing the supporting plates (not shown) on the second protective layer 154a of the second flexible circuit substrate 140a and the second protective layer 154b of the second flexible circuit substrate 140b separately. These supporting plates cover the region 140R (denote in FIG. 4D) of the second flexible circuit substrate 140a and the second flexible circuit substrate 140b and expose the surrounding region 142S of the second flexible circuit substrate 140a and the second flexible circuit substrate 140b. Afterward, the second flexible circuit substrate 140a and the second flexible circuit substrate 140b on two opposite sides are laminated by the steel lamination plates (not shown). The surrounding region 142S of the second flexible circuit substrate 140a and the second flexible circuit substrate 140b are adhered to the second adhesive material 112a and the second adhesive material 112b by the pressuring from the steel lamination plates.

In addition, since the supporting plates resist against the pressure from the lamination steel plates at the region 140R, the region 140R of the second flexible circuit substrate 140a and the second flexible circuit substrate 140b is not laminated. As a result, the region 140R of the second flexible circuit substrate 140a and the second flexible circuit substrate 140b protrudes from the surface of the surrounding region 142S. Referring to FIG. 1, since the center part of the region 140R is located at the bending part 101, and the surrounding parts of the region 140R are located at the border areas between the bending part 101 and the connecting part 103A and the connecting part 103B, an accommodation spacing located at the bending part 101 for the corrugated region 122 is formed. This accommodation spacing is beneficial to the flexural strength of the circuit board 100.

Figure 5C:
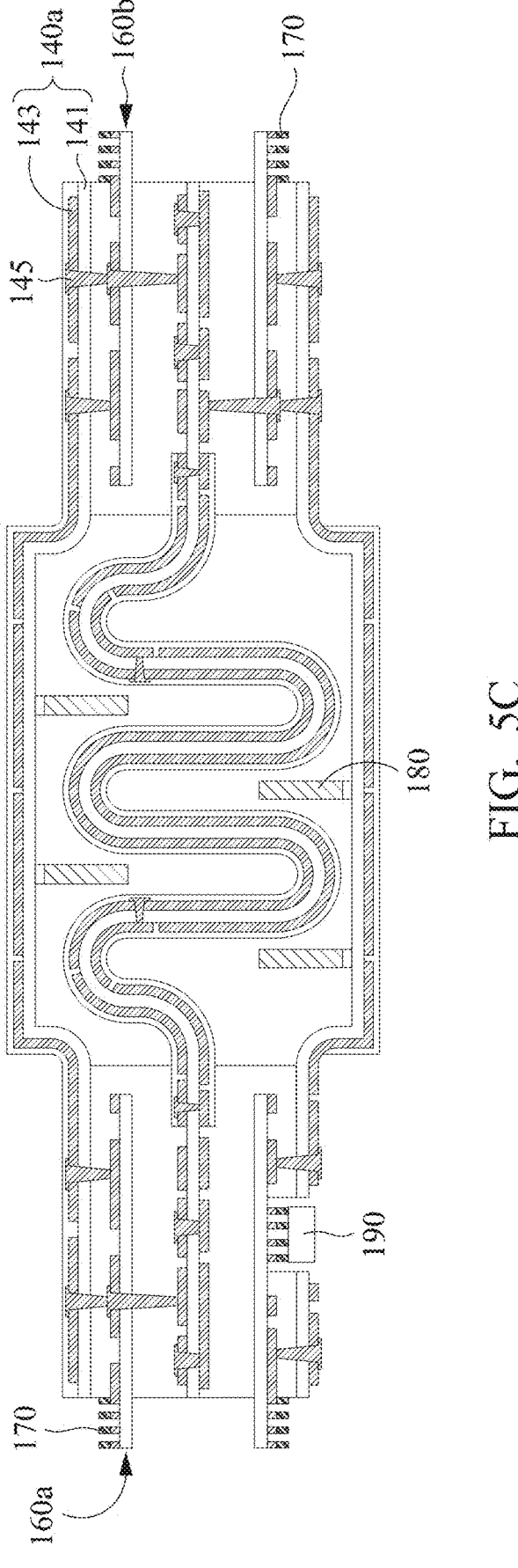

Referring to FIG. 5C, in this embodiment, the method for fabrication of the circuit board 100 further includes forming conductive vias 145 after the second flexible circuit substrate 140a and the second flexible circuit substrate 140b are separately disposed on the second adhesive material 112a and the second adhesive material 112b. These conductive vias 145 extend from the circuit layer of the second flexible circuits substrate (e.g. the circuit layer 143 of the second flexible circuit substrate 140a) to circuit layer of the third circuit substrate (e.g. the third circuit substrate 160a and the third circuit substrate 160b). In some embodiments, the conductive vias 145 and the conductive vias 165 are formed by laser drilling for blind vias and by filling metal pastes into those blind vias. Furthermore, in some other embodiments, the conductive vias 145 and the conductive vias 165 may be formed by mechanical drilling for blind vias and by electroplating in those blind vias.

In addition, in some embodiments, the circuit layer 143 of the second flexible circuit substrate 140a and the second flexible circuit substrate 140b may be formed by patterning process after the second flexible circuit substrate 140a and the second flexible circuit substrate 140b are separately disposed on the second adhesive material 112a and the second adhesive material 112b. That is, the sequence of forming the circuit layer 143 is not limited to aforementioned embodiments.

It is worth mentioning, only a part of the second protective layer 154a is formed on the second flexible circuit substrate 140a in the step illustrated in FIG. 4C. Hence, the method for fabrication of the circuit board 100 further includes forming the other part of the second protective layer 154a on the second flexible circuit substrate 140a and forming the other part of the second protective layer 154*b* on the second flexible circuit substrate 140*b* after the conductive vias 165 are formed.

Referring to FIG. 50, the method for fabrication of the circuit board 100 further includes disposing the metal components 170 on a part of the circuit layers (not denoted) of the third circuit substrate 160*a*, the third circuit substrate 160*b*, the third circuit substrate 160*c* and the third circuit substrate 160*d* by method of electroless nickel immersion gold (ENIG). In some embodiments, the method for fabrication of the circuit board 100 further includes disposing electronic component 190 on the third circuit substrate 160*a*, the third circuit substrate 160*b*, the third circuit substrate 160*c* and the third circuit substrate 160*d* by soldering.

In conclusion, the elastic materials are disposed on the second flexible circuit substrate in the bending part, and the elastic materials are disposed inside the troughs of the corrugated region of the first flexible circuit substrate in the disclosure. Therefore, when the bending part of the circuit board is under the bending state which caused by the external force, the elastic materials are touched and pressed by the inner sides of the troughs of the corrugated region, so that the restoring forces of the elastic materials are generated. The restoring forces may lead the corrugated region to its original corrugated state from the stretched state when the bending part is flattened, thereby improving the flexural strength of the circuit board.

Although the embodiments of the present disclosure have been disclosed as above in the embodiments, they are not intended to limit the embodiments of the present disclosure. Any person having ordinary skill in the art can make various changes and modifications without departing from the spirit and the scope of the embodiments of the present disclosure. Therefore, the protection scope of the embodiments of the present disclosure should be determined according to the scope of the appended claims.

What is claimed is:

1. A circuit board having a bending part and at least one connecting part, comprising:
    a first flexible circuit substrate comprises:
        a corrugated region, located at the bending part of the circuit board;
    at least a second flexible circuit substrate, electrically connected to the first flexible circuit substrate disposed on the second flexible circuit substrate,
    wherein a spacing is formed between the first flexible circuit substrate and the second flexible circuit substrate, and the spacing is located at the bending part; and
    an elastic material, disposed on the second flexible circuit substrate and located inside the spacing,
    wherein the elastic material is located inside a trough of the corrugated region.

2. The circuit board of claim 1, further comprising:
    two first protective layers, disposed on the corrugated region of the first flexible circuit substrate and covering two opposite sides of the first flexible circuit substrate separately; and
    at least one second protective layer, disposed on a surface of the second flexible circuit substrate,
    wherein the second flexible circuit substrate is located between the second protective layer and the first flexible circuit substrate.

3. The circuit board of claim 1, wherein a part of a surface of the second flexible circuit substrate located at the bending part protrudes from a part of a surface of the second flexible circuit substrate located at the connecting part.

4. The circuit board of claim 3, wherein when the circuit board is under a flattened state, a thickness of the bending part is larger than a thickness of the connecting part.

5. The circuit board of claim 1, further comprising:
    at least one adhesive layer, disposed on the connecting part of the circuit board and located between the first flexible circuit substrate and the second flexible circuit substrate, wherein the adhesive layer covers the first flexible circuit substrate.

6. The circuit board of claim 1, further comprising:
    at least one third circuit substrate, disposed on the connecting part of the circuit board and electrically connected to the first flexible circuit substrate and the second flexible circuit substrate,
    wherein the third circuit substrate is located between the first flexible circuit substrate and the second flexible circuit substrate.

7. The circuit board of claim 6, wherein the third circuit substrate is a rigid board.

8. The circuit board of claim 7, further comprising:
    a plurality of metal components, disposed on an end section of the third circuit substrate.

9. The circuit board of claim 1, further comprising:
    a plurality of metal components, disposed on an end section of the first flexible circuit substrate.

10. The circuit board of claim 7, further comprising:
    an electronic component, disposed on the third circuit substrate.

11. A method for fabricating a circuit board, comprising:
    providing a first flexible circuit substrate;
    bending a first region of the first flexible circuit substrate to form a corrugated region;
    providing two second flexible circuit substrates;
    disposing a plurality of elastic materials on a second region of each of the second flexible circuit substrates;
    providing four third circuit substrates;
    disposing the third circuit substrates on the first flexible circuit substrate, so that one edge of the first flexible circuit substrate is located between two of the third circuit substrates, and the other edge of the first flexible circuit substrate is located between the other two of the third circuit substrates,
    wherein the third circuit substrates expose the corrugated region of the first flexible circuit substrate; and
    disposing the second flexible circuit substrates on the third circuit substrates after the elastic materials are disposed on the second region of each of the second flexible circuit substrates, so that the first flexible circuit substrate and the third circuit substrate are located between two second flexible circuit substrates,
    wherein the corrugated region of the first flexible circuit substrate overlaps the second regions of the second flexible circuit substrates, and the elastic materials are located between the second flexible circuit substrates,
    wherein the elastic materials are located inside a plurality of troughs of the corrugated region separately.

12. The method of claim 11, further comprising:
    forming a first protective layer on each of two opposite surfaces of the first flexible circuit substrate before the first region of the first flexible circuit substrate is bent, wherein the first protective layers cover the first region of the first flexible circuit substrate; and
    forming a part of a second protective layer on one surface of each second flexible circuit substrate before the elastic materials are disposed on the second region of each of the second flexible circuit substrates, and the part of the second protective layer covers the second regions of the second flexible circuit substrates, wherein the elastic materials and the second protective layer are located at two opposite sides of the second flexible circuit substrate separately.

13. The method of claim 11, further comprising:

disposing a first adhesive material on two opposite sides of the first flexible circuit substrate separately before the third circuit substrates are disposed on the first flexible circuit substrate, wherein the first adhesive materials expose the corrugated region of the first flexible circuit substrate;

laminating the first flexible circuit substrate, the first adhesive materials and the third circuit substrates after the first adhesive materials are disposed on the first flexible circuit substrate, so that two of the third circuit substrates are disposed on one of the first adhesive materials, and the other two of the third circuit substrates are disposed on the other one of the first adhesive materials;

disposing a second adhesive material separately on two of each third circuit substrates located on two opposite sides of the first flexible circuit substrate before the second flexible circuit substrates are disposed on the third circuit substrates, wherein the second adhesive materials expose the corrugated region of the first flexible circuit substrate; and laminating the second flexible circuit substrates, the third circuit substrates and the second adhesive materials after the second adhesive materials are disposed on the third circuit substrates, so that the second flexible circuit substrates are disposed on the second adhesive materials separately, and the second adhesive materials are located between the second flexible circuit substrates.

14. The method of claim 13, further comprising:

forming a plurality of first conductive vias after the third circuit substrates are disposed on the first adhesive materials, wherein the first conductive vias extend from a first circuit layer of the first flexible circuit substrate to a third circuit layer of one of the third circuit substrates; and forming a plurality of second conductive vias after the second flexible circuit substrates are disposed on the second adhesive materials separately, wherein the second conductive vias extend from a second circuit layer of the second flexible circuit substrates to the third circuit layer of one of the third circuit substrates.

15. The method of claim 13, wherein laminating the second flexible circuit substrates, the third circuit substrates and the second adhesive materials comprising:

disposing two supporting plates on the second protective layer of each of the second flexible circuit substrates separately, wherein the supporting plates cover the second regions of the second flexible circuit substrates, and the corrugated region of the first flexible circuit substrate overlaps the second regions.

16. The method of claim 15, wherein the second regions of the second flexible circuit substrates protrude from a surface of a surrounding region of each of the second flexible circuit substrates.

17. The method of claim 11, further comprising:

disposing an electronic component on the third circuit substrates.

* * * * *